(12) United States Patent
Takano et al.

(10) Patent No.: US 6,374,378 B1
(45) Date of Patent: Apr. 16, 2002

(54) FAILURE ANALYSIS MEMORY FOR SEMICONDUCTOR MEMORY TESTING DEVICES AND ITS STORAGE METHOD

(75) Inventors: Katsuhiko Takano; Shinya Sato, both of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/185,184

(22) Filed: Nov. 3, 1998

(30) Foreign Application Priority Data

Nov. 10, 1997 (JP) .......................................... 09/307026

(51) Int. Cl.[7] .............................. G11C 29/00; G11C 7/00
(52) U.S. Cl. ..................................................... 714/719
(58) Field of Search ................................ 714/718, 719, 714/722; 365/201

(56) References Cited

U.S. PATENT DOCUMENTS

| | | | | |
|---|---|---|---|---|
| 4,051,354 A | * | 9/1977 | Choate | 714/711 |
| 4,426,688 A | * | 1/1984 | Moxley | 365/200 |
| 4,527,251 A | * | 7/1985 | Nibby, Jr. et al. | 714/8 |
| 4,627,053 A | * | 12/1986 | Yamaki et al. | 714/711 |
| 4,628,509 A | * | 12/1986 | Kawaguchi | 714/711 |
| 4,788,684 A | * | 11/1988 | Kawaguchi et al. | 714/719 |
| 4,876,685 A | * | 10/1989 | Rich | 714/723 |
| 5,317,573 A | * | 5/1994 | Bula et al. | 714/711 |
| 5,485,425 A | * | 1/1996 | Iwai et al. | 365/200 |
| 5,644,578 A | * | 7/1997 | Ohsawa | 714/719 |
| 5,781,717 A | * | 7/1998 | Wu et al. | 714/8 |
| 6,032,264 A | * | 2/2000 | Beffa et al. | 714/7 |
| 6,041,422 A | * | 3/2000 | Deas | 714/8 |
| 6,052,798 A | * | 4/2000 | Jeddeloh | 714/8 |
| 6,173,238 B1 | * | 1/2001 | Fujisaki | 702/117 |

FOREIGN PATENT DOCUMENTS

| | | |
|---|---|---|
| JP | 1311500 | 12/1989 |
| JP | 6231599 | 8/1994 |

* cited by examiner

*Primary Examiner*—Albert Decady
*Assistant Examiner*—Joseph D. Torres
(74) *Attorney, Agent, or Firm*—David N. Lathrop, Esq.; Gallagher & Lathrop

(57) ABSTRACT

Output data from memories under test and expectation data are compared by logic comparators, then the comparison results are input as fail data into fail data compressing/bit positions, and the data are compressed in the data-width direction into one-bit data displaced apart in bit position. When a control signal is "1," hey are stored in a memory section at corresponding bit positions. When the control signal is "0," the fail data from one logic comparator is stored intact in the memory part.

6 Claims, 7 Drawing Sheets

FAILURE ANALYSIS MEMORY FOR SEMICONDUCTOR MEMORY TESTING DEVICES AND ITS STORAGE METHOD

BACKGROUND OF THE INVENTION

The present invention relates to a failure analysis memory for storing information on memory cells found defective in a logical comparison test on semiconductor memories through the use of test patterns. The invention also pertains to a method for storing required information on the failed memory cells in the failure analysis memory.

DESCRIPTION OF THE PRIOR ART

FIG. 1 illustrates in block form the basic configuration of a conventional memory testing device. The memory testing device comprises a timing generator 11, a pattern generator 12, a waveform shaper 13, a logic comparator 15 and a failure analysis memory 16, and makes a test on a memory under test 14.

Based on a reference clock generated by the timing generator 11, the pattern generator 12 produces an address signal ADR, test data DAT and a control signal CONT which are provided to the memory under test 14.

These signals ADR, DAT and CONT are shaped by the waveform shaper 13 into waveforms necessary for test and then applied to the memory under test 14. Under the control of the control signal CONT the test data DAT is written in and read out of the memory 14. The test data DAT read out of the memory 14 is fed to the logic comparator 15 for comparison with expectation data PDAT available from the pattern generator 12 to check for a mismatch therebetween and hence make a pass/fail decision on the memory under test 15. If a mismatch is found, then fail data is stored in the failure analysis memory 16.

FIG. 2 depicts the general configuration of the conventional failure analysis memory 16. The failure analysis memory 16 comprises an address select part 16A, a memory control part 16B and a memory part 16C. The memory part 16C is accessed by a lower address signal from the address select part 16A. The address select part 16A is designed to be capable of arbitrarily selecting individual address signals ADR available from the pattern generator 12; the upper address signal is applied to the memory control part 16B and the lower address signal to the memory part 16C. The memory control part 16B responds to fail data FLA from the logic comparator 15 to apply a write signal to the memory part 16C, and responds to the upper address signal to select a cell in the memory 16C where to store failure information on the memory under test 14. After the test, the stored contents of the memory part 16C are checked for a failed address in the memory under test 14.

Current-day IC memories are becoming increasingly high in capacity and in integration density. With a system which would reject an IC memory in its entirety as defective if even one failed cell is found, it is impossible to increase the productivity (manufacturing yield) of IC memories. In view of this, recent IC memories have a redundant configuration intended to save or repair their failed cells.

The redundant configuration is one that the IC memory has built-in spare cells in preparation for replacement for failed cells during the manufacturing process to avoid rejection of the whole IC memory as being defective and hence improve productivity. Semiconductor IC testers utilize the failure analysis memory to make a repair analysis for detecting a defective cell and replacing it with a spare cell.

In FIG. 3A there is depicted an example of the internal configuration of the memory under test 14 which has a four-bit data width and a four-word address depth. In general, the IC memory is provided with an address decoder 14A, a main memory cell array 14B and a four-bit spare cell array 14C. Based on the address signal ADR which is input into the address decoder 14A, any one of addresses ADR1, ADR2, ADR3 and ADR4 of the main memory cell array 14B is accessed to effect the writing and reading of test data to and from respective memory cells MCL of the accessed address.

When failed memory cells FMCL are found, through repair analysis using the failure analysis memory 16, at the accessed address as indicated by hatching in FIG. 3B, the analytical information is used to replace the whole memory cell array MCL containing the failed cells FLMC with the spare cell array 14C and switch the application of the address signal ADR from the former to the latter, thereby saving the IC memory 14 from being rejected as a defective. This replacement is performed using a dedicated repair unit (such as a laser trimmer or fuse system).

If all pieces of fail data on the memory under test 14 (data indicating the failed cells FLMCL) are written in the failure analysis memory 16 to make the repair analysis, the memory 16 needs to have a large capacity and the analysis takes much time. In the memory under test 14 depicted in FIG. 3A, the spare cell array 14C has a line structure extending in the data-width direction so that spare cells have a one-to-one correspondence with data bits of each word. Accordingly, when even one failed cell is found in one word in its data-width direction (hereinafter referred to as an I/O direction), all cells of one word will have to be replaced with the spare cell array 14C. What is required as information for the repair analysis is only the presence or absence of failed cells FLMCL in each word. Hence, information necessary and sufficient for the repair analysis could be obtained even by compressing all pieces of bit data in the widthwise direction of the fail data into one-bit form through their ORing by an OR gate. This will reduce the amount of time for analysis as well as the fail data size. The ORing of the bit data in the widthwise direction of the fail data to obtain new fail data will hereinafter be referred to as a fail data I/O compression.

In FIGS. 4 and 5 there is conceptually shown a fail data compression feature built in the conventional failure analysis memory 16. FIG. 4 depicts the case of testing four memories 14A to 14D. Four logic comparators 15A to 15D output, as fail data FLA to FLD, the logical comparison results on the four memories under test 14A to 14D. Reference numerals 23A to 23D and 41A to 41D denote respective pieces of data.

These pieces of fail data FLA to FLD are input into fail data compressing/bit position setting means 20A to 20D, respectively, wherein each multi-bit fail data is compressed into one-bit fail data. The pieces of the thus compressed fail data FLA to FLD are written in the memory parts 16C corresponding to the memories under test 14A to 14D.

FIG. 5 illustrates the configuration of the fail data compressing/bit position setting means 20 (20A to 20D). The fail data compressing/bit position setting means 20 has bit position setting means 21A to 21D of the same number as that of bits FL0 to FL3 of one of the fail data FLA to FLD. The bit position setting means 21A to 21D have bit position setting registers 21A to 21D, respectively. Based on data set in the bit position setting registers 22A to 22D, the fail data compressing/bit position setting means 20 selects a compression or non-compression mode and sets the bit position which it outputs in the compression mode.

That is, in the case of setting "1, 1, 1, 1," in the bit position setting register 22A of the bit position setting means 21A and "0, 0, 0, 0" in the other bit position setting registers 22B to 22D as shown in FIG. 5, fail data compressed in the compression mode is output as first-bit data CFL0 of the output data. More specifically, "1's" of the respective bits of the bit position setting register 22A are ANDed by four AND circuits 24A with the fail data FL0 to FL3. The outputs from the four AND circuits 24A are input into an OR circuit 25A, and the output from the OR circuit 25A is provided as the first bit CFL0 of the compressed fail data output signal to the memory part 16C. Similarly, the other bit position setting means 21B (to 21D) also comprise the bit position setting register 22B (to 22D), four AND circuits 24B (to 24D) and one OR circuit 25B (to 25D).

On the other hand, in the case of setting "0,0,0,1" in the bit position setting register 22A, "0,0,1,0" in the bit position setting register 22B, "0,1,0,0" in the bit position setting register 22C and "1,0,0,0" in the bit position setting register 22D, the fail data FL0 is output as the first-bit data CFL0, the fail data FL1 as second-bit data CFL2, the fail data FL2 as third-bit data CFL2 and the fail data FL3 as fourth-bit data CFL3. That is, the fail data is written intact in the memory part 16C without being compressed. Reference numeral 42 denotes the data to be written in the memory part 16C.

As described above, it is conventional to provide the fail data compressing/bit position setting means 20 in each failure analysis memory 16 and switch between the compression and the non-compression mode for each failure analysis memory 16.

Problems of the above-described prior art will be described below, for example, in connection with the case where the memory part 16C of the failure analysis memory 16 has a data width of four bits and an address depth of four addresses and the memory under test has a data width of four bits and an address depth of 16 addresses. In writing fail data necessary for repair analysis in the failure analysis memory 16 after I/O compression as shown in FIG. 6, the I/O compression reduces the memory capacity needed. Hence, it is possible that compressed fail data for words (addresses) 0 to 3 of the memory under test 14 is stored in a memory space M0 of the memory part 16C and that the remaining memory spaces M1, M2 and M3 are concatenated in the address direction to store compressed fail data corresponding to deeper addresses 4 to 7, 8 to 11 and 12 to 15, respectively. However, when the address depth of the memory under test 14 is equal to the address depth of the memory part 16C of the failure analysis memory 16, there are cases where some space of the memory part 16C remains unused as described below.

The semiconductor memory tester performs simultaneous testing on a plurality of memories of the same type in many cases. In FIG. 4 there is shown how fail data for the repair analysis of four memories under test 14 of the same type as that depicted in FIG. 3 is written in the failure analysis memory 16. Conventionally, the failure analysis memory 16 has the same data width as that of noncompressed data of the memory under test 14 so that it can store noncompressed fail data as well. Since the noncompressed data width of the memory under test 16 is four-bit, the memory part 16C of the four-bit data width is needed for each memory under test 14. When it is written in the failure analysis memory 16, the fail data for repair analysis is compressed to one-bit form for each address, so that no fail information is stored in the memory part 16C over the remaining 3-bit by 4-word memory space as indicated by hatching in FIG. 4. Since fail data of other memories under test 14 cannot be assigned to the remaining unoccupied memory space, the memory part 16C cannot be shared among the memories under test 14. Accordingly, the memory space of the memory part 16C of the failure analysis memory 16, except the space for storing the fail data necessary for repair analysis, is wasted, that is, the memory space corresponding to number of memories under test×(data width before compression−data width after compression) goes to waste. With an increase in the difference between the data width of the memory under test 14 and the data width after compression, the memory space of the failure analysis memory 16 which remains unused increases.

Future DRAMs and other semiconductor devices will have higher operating frequencies and larger data widths so as to ensure faster data transfer. The I/O compression of fail data will also be performed frequently in testing memories of varied redundant configurations. Besides, the number of semiconductor IC memories for simultaneous testing by each semiconductor memory tester is on the increase with a view to cutting the cost of testing each IC memory. However, if the number of failure analysis memories increases with an increase in the number of semiconductor IC memories for simultaneous testing, the semiconductor memory tester will inevitably become bulky and expensive.

SUMMARY OF THE INVENTION

An object of the present invention is to provide a failure analysis memory which efficiently stores compressed fail data without leaving any cells unused, and a method for storing therein the compressed fail data.

According to the present invention, there is provided a semiconductor memory testing device which sends a test pattern to each of a plurality of memories under test, causes it to temporarily store the test pattern, reads out therefrom the stored content, compares it with an expectation pattern by a logic comparator to check for a mismatch therebetween indicating the presence of a failed memory cell of the memory under test, and stores the failed memory cell information in the corresponding failed cell address in a failure analysis memory provided in correspondence with each memory under test and in which the failure analysis memory is provided with a memory part having, for each address, memory cells of the same number as and respectively corresponding to the memories under tests so that fail data on each memory under test is stored in the corresponding memory cell after being compressed.

With the failure analysis memory of the present invention, fail data can be stored in the memory part efficiently without leaving any memory cells unused as long as the fail data is stored in compressed form. Hence, the present invention permits reduction of the storage capacity of the failure analysis memory used, and consequently cuts the manufacturing costs of the semiconductor memory testing device.

DETAILED DESCRIPTION OF THE PREFERRED EMBODIMENT

Figure 1:
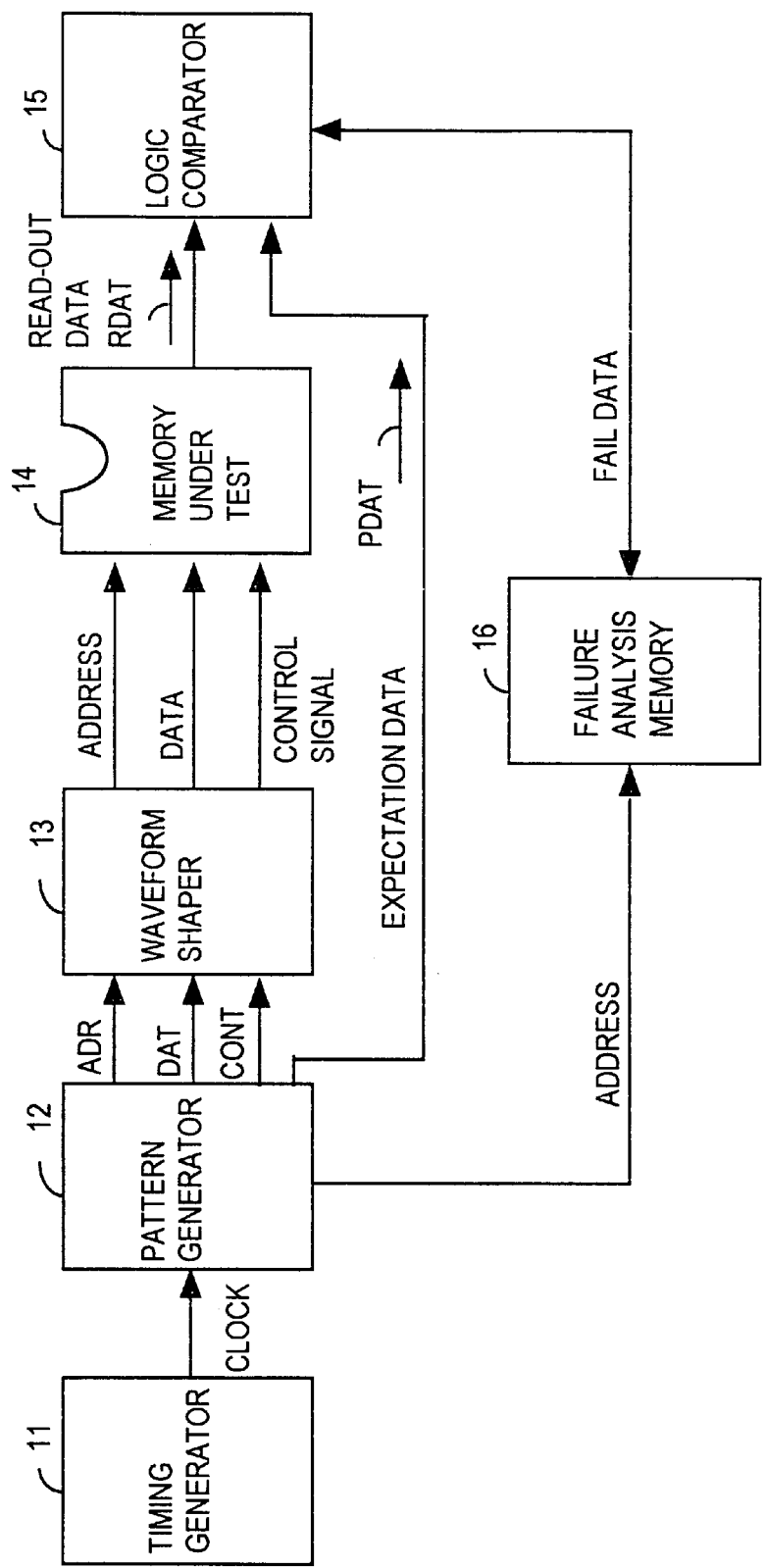
FIG. 1 is a block diagram illustrating the basic configuration of a conventional semiconductor memory testing device.
Figure 2:
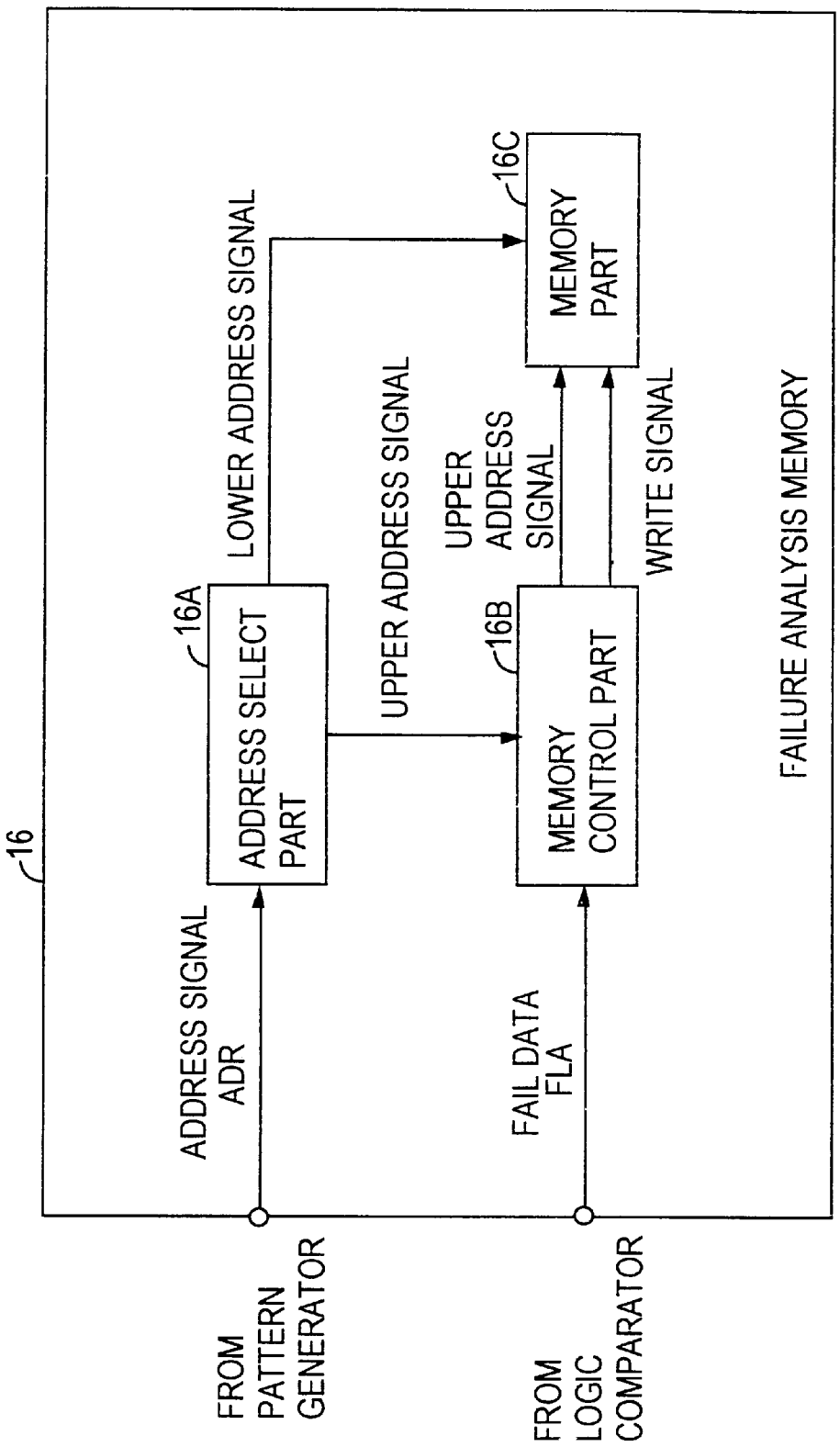
FIG. 2 is a block diagram depicting the general configuration of a failure analysis memory for use in the conventional semiconductor memory testing device of FIG. 1.
Figure 3A:
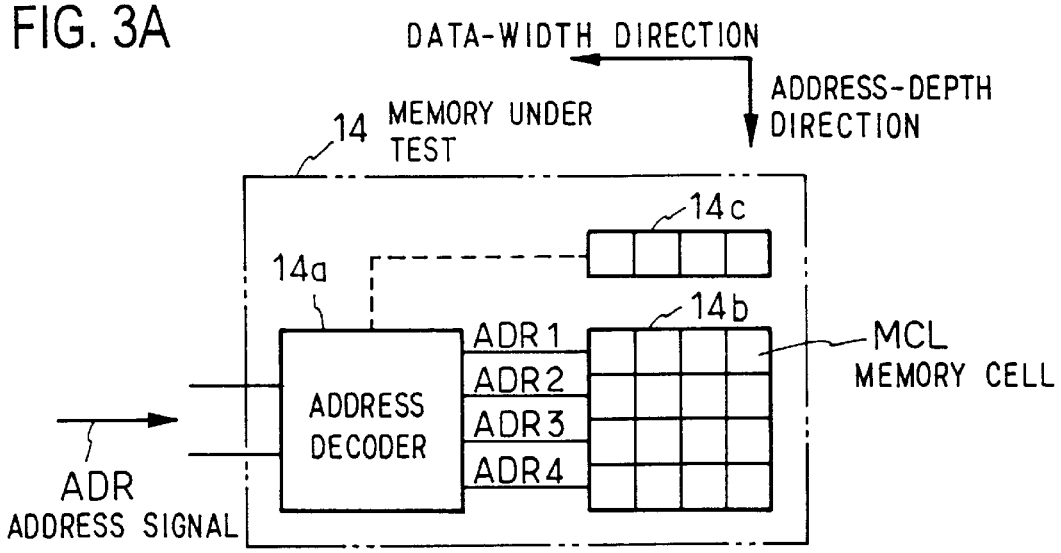
FIG. 3A is a block diagram depicting the internal configuration of a semiconductor memory.
Figure 3B:
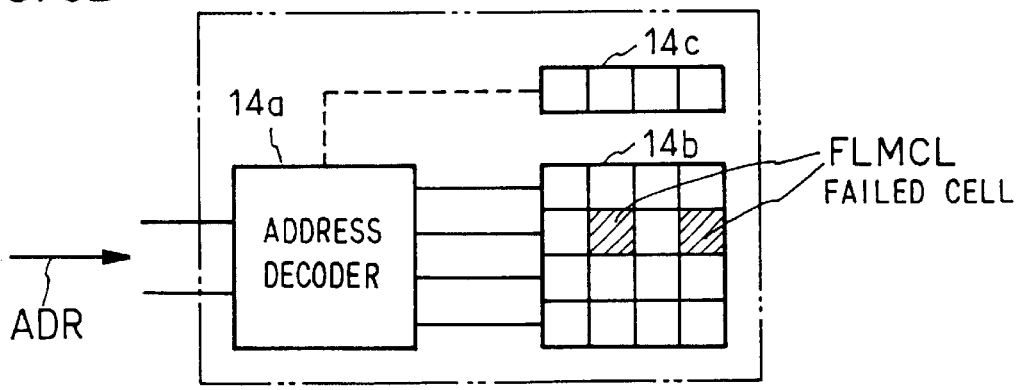
FIG. 3B is a block diagram depicting the presence of failed cells in the semiconductor memory.
Figure 3C:
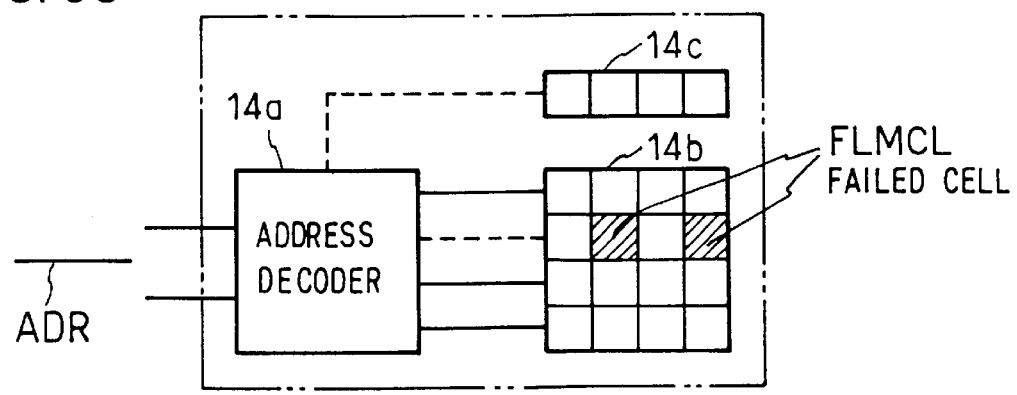
FIG. 3C is a block diagram for explaining how the failed cells are replaced with spare cells.
Figure 4:
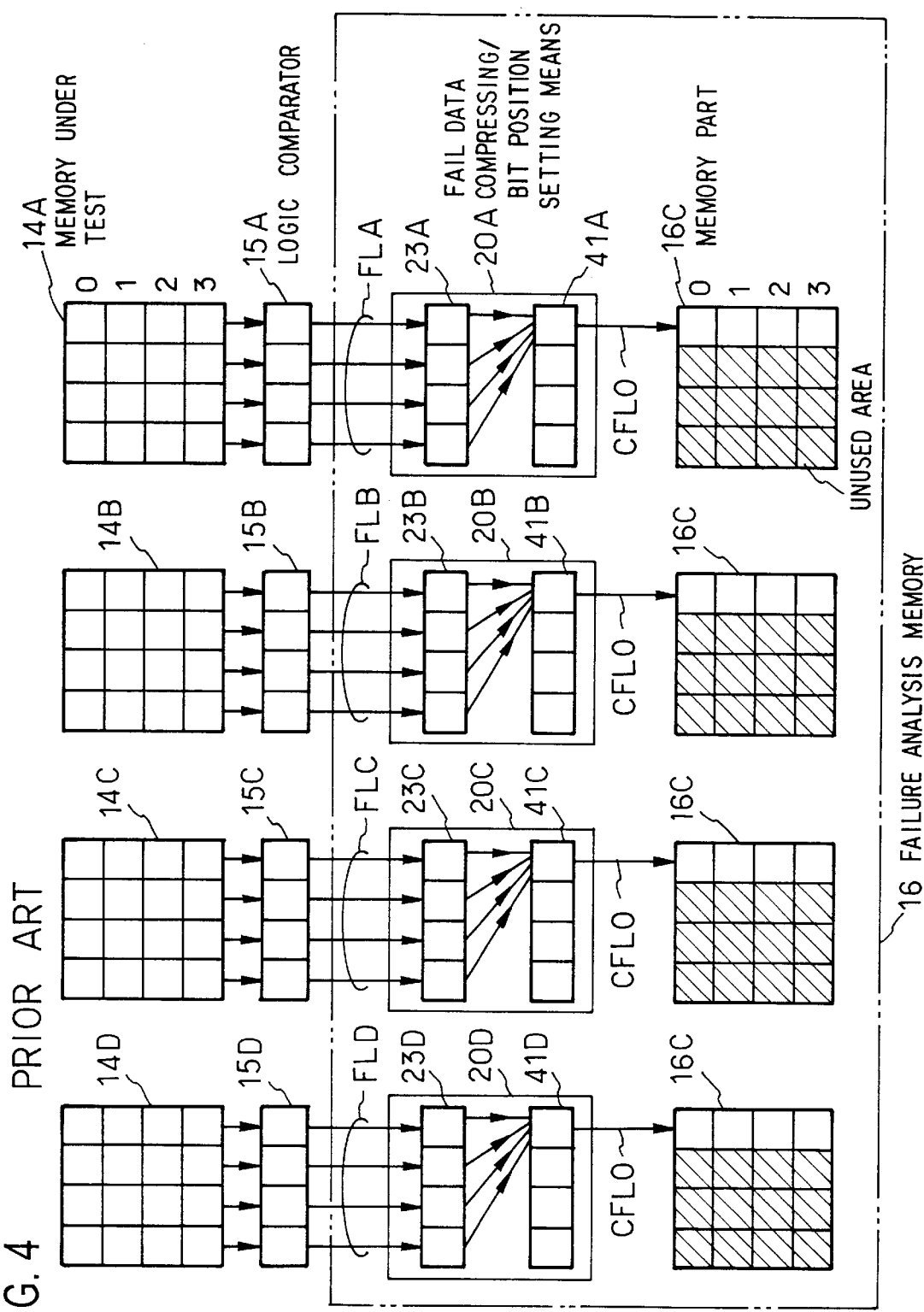
FIG. 4 is a block diagram for explaining the compression of fail data and its writing in a failure analysis memory in the case of testing a plurality of IC memories by one testing device in the prior art.
Figure 5:
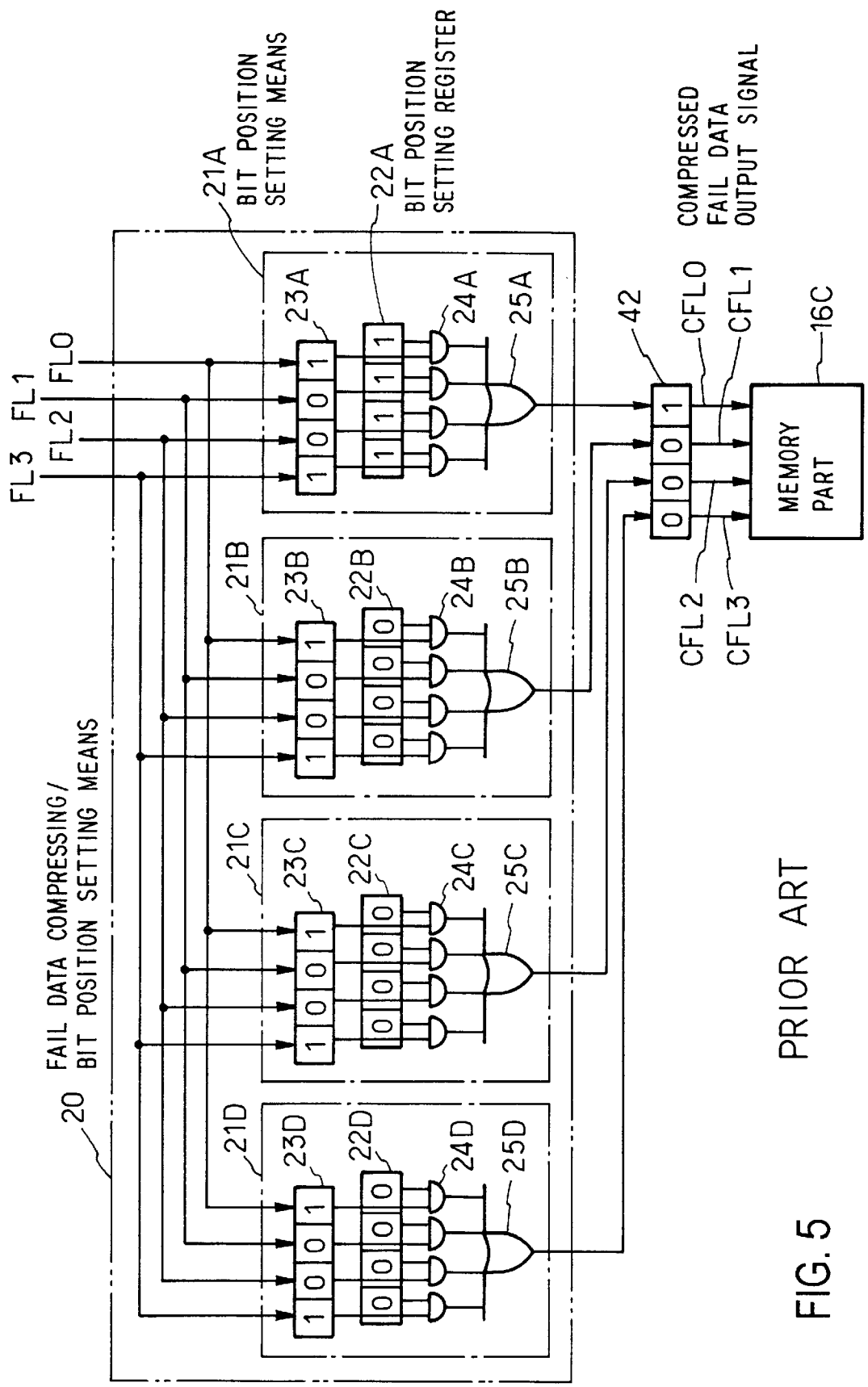
FIG. 5 is a block diagram depicting the internal configuration of fail data compressing/bit position setting means shown in FIG. 4.
Figure 6:
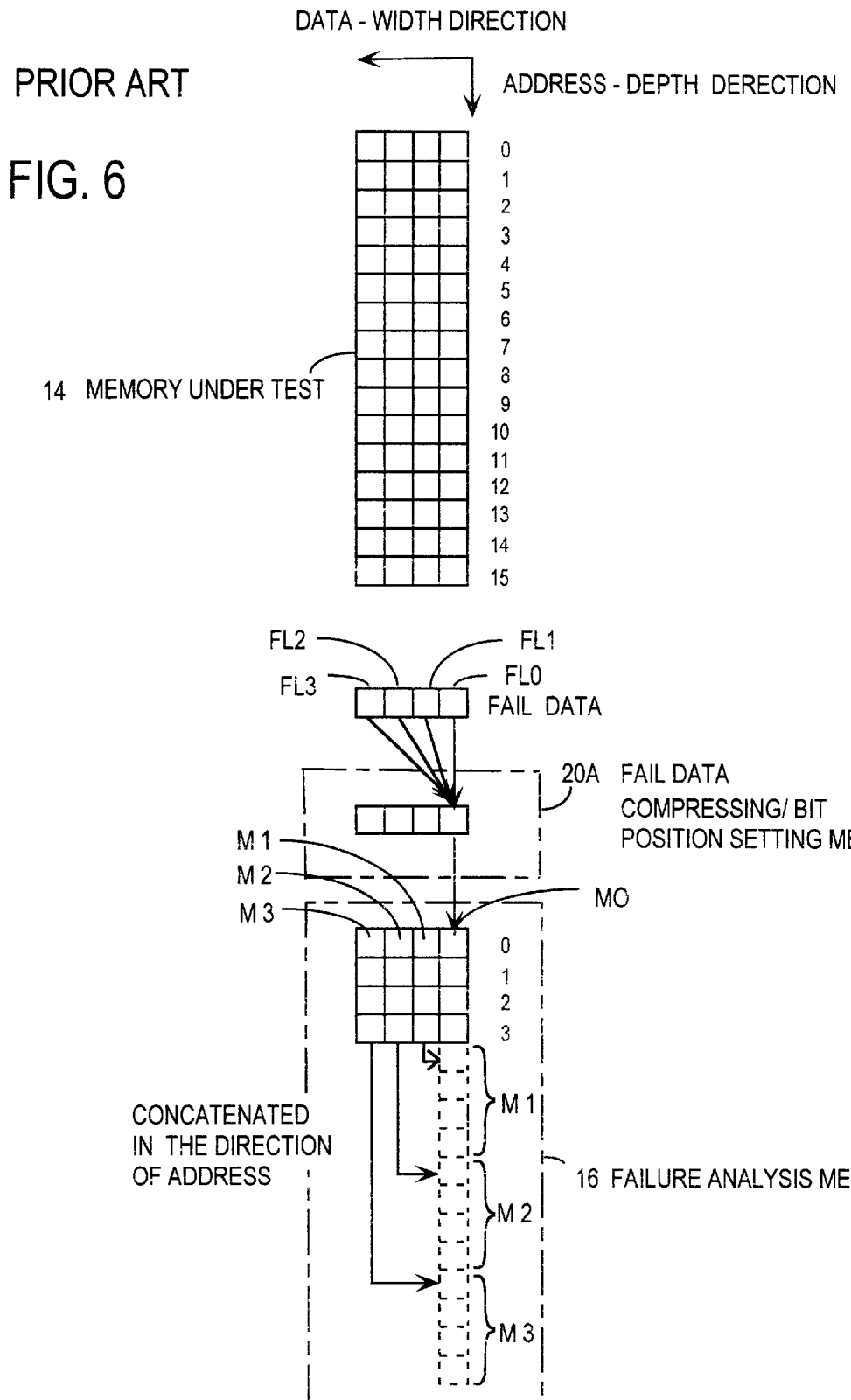
FIG. 6 is a diagram for explaining a conventional fail data compression method.
Figure 7:
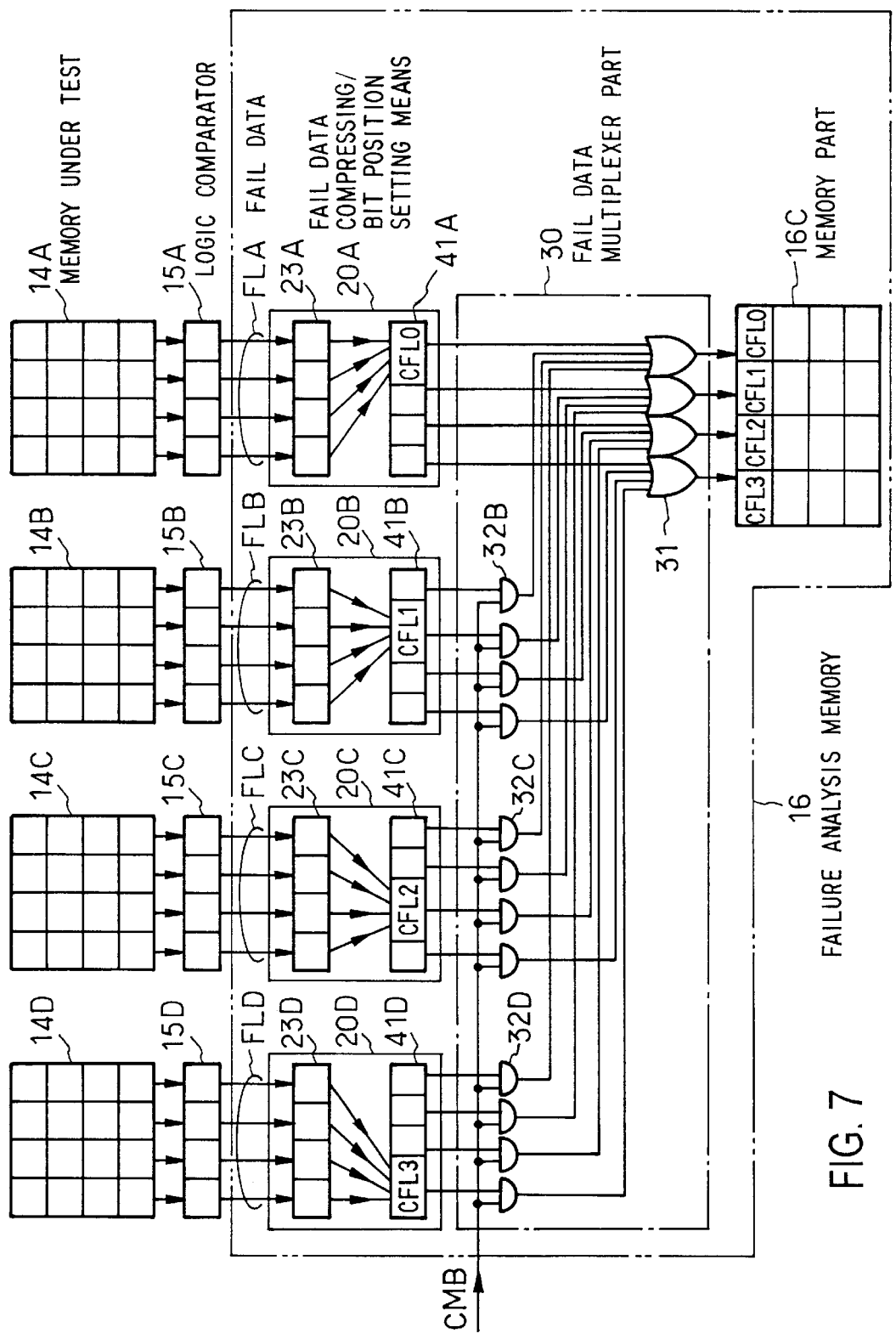
FIG. 7 is a block diagram illustrating an embodiment of the failure analysis memory according to the present invention.

In FIG. 7 there is depicted the configuration of the failure analysis memory 16 for use in the semiconductor memory testing device according to the present invention. The parts corresponding to those in FIGS. 4 and 5 are identified by the same reference numerals. The failure analysis memory 16 has a plurality of fail data compressing/bit position setting means 20A, 20B, 20C and 20D and a fail data multiplexer part 30 placed at a stage following them.

The fail data compressing/bit position setting means 20A to 20D are identical in construction with that 20 depicted in FIG. 5, and are each capable of compressing fail data, setting the bit position of the compressed fail data as data CFL0 to CFL3 of an arbitrary bit position and outputting it as noncompressed data. The FIG. 7 embodiment shows the case where the fail data compressing/bit position setting means 20A compresses the fail data FLA and sets the compressed data to be output as the data CFL0 of the first bit position. The setting of the bit position is implemented by setting "1, 1, 1, 1" in the bit position setting register 22A depicted in FIG. 5.

In the illustrated embodiment, the fail data compressing/bit position setting means 20B compresses the fail data FLB and sets the compressed data to be output as the data CFL1 of the second bit position. The fail data compressing/bit position setting means 20C compresses the fail data FLC and sets the compressed fail data to be output as the data CFL2 of the third bit position. Similarly, the fail data compressing/bit position setting means 20D compresses the fail data FLD and sets the compressed fail data to be output as the data CFL3 of the fourth bit position.

The compressed fail data CFL0 to CFL3 output from the fail data compressing/bit position setting means 20A to 20D are input into the fail data multiplexer part 30. By making a control signal CMB high-level (a "1") which is applied to the fail data multiplexer part 30, the compressed outputs from the fail data compressing/bit position setting means 20A to 20B are all fed to the memory part 16C, wherein the data CFL0, Cfl1, CFL2 and CFL3 are written in first to fourth bit positions, respectively.

By setting the control signal CMB at the low level (a "0"), the fail data multiplexer part 30 inhibits the passage therethrough of the outputs from the fail data compressing/bit position setting means 20B to 20D for input into the memory part 16C. Accordingly, in this case, the fail data compressing/bit position setting means 20A is allowed to use the memory part 16C singly and hence store the fail data intact without compressing it. That is, in the fail data multiplexer part 30 the data outputs of four bits from the fail data compressing/bit position setting means 20A are applied to four OR circuits 31; data outputs of four bits from the fail data compressing/bit position setting means 20A are applied to four AND circuits 32B; and data outputs of four bits from the fail data compressing/bit position setting means 20a and 20D are also similarly applied to quartets of AND circuits 32A and 32D, respectively. The outputs from the quartets of AND circuits 32B, 32C and 32D are fed to four OR circuits 31, respectively, with the outputs of the same bit position applied to the same OR circuit. The control signal CMB is applied as another input to each of the AND circuits 32B, 32C and 32D. The outputs from the four OR circuits 31 are provided as the output data CFL0 to CFL3 to the memory part 14C.

As described above, according to the present invention, in the case of testing a plurality of memories by one testing device, fail data of each memory under test is compressed and the compressed fail data is assigned to and stored in the respective bit positions of the memory part 16C in the failure analysis memory 16. Hence, it is possible with one failure analysis memory 16 to store and analyze fail data from the plurality of memories under test to determine whether they can be saved from being rejected as being defective.

In the case of testing only one memory, the failure analysis memory according to the present invention permits storage therein of fail data without compression and provides information on the positions of failed cells, making it possible to clear up the cause of the failure. Thus, the present invention allows effective use of one failure analysis memory and hence prevents the memory testing device from becoming bulky and expensive.

It will be apparent that many modifications and variations may be effected without departing from the scope of the novel concepts of the present invention.

What is claimed is:

1. A failure analysis memory for storing fail data which is the result of comparison by logic comparators between data read out of a plurality of memories under test and expectation data, said failure analysis memory comprising:

a plurality of fail data compressing/bit position setting means each supplied with said fail data from one of said logic comparators, for compressing said fail data into one-bit fail data and for outputting it to a different bit position; and a memory part for storing therein at corresponding bit positions of respective words said compressed fail data of different bit positions from said plurality of fail data compressing/bit position setting means.

2. The failure analysis memory of claim 1, wherein at least one of said plurality of fail data compressing/bit position setting means comprises:

select means for selectively outputting one of said compressed fail data and noncompressed fail data; and a fail data multiplexer part provided between said plurality of fail data compressing/bit position setting means and said memory part, for selectively supplying one of said compressed fail data from said plurality of fail data compressing/bit position setting means and noncompressed fail data from one of said fail data compressed bit position setting means to said memory part.

3. The failure analysis memory of claim 2, wherein said fail data compressing/bit position setting means each have bit position setting means of the same number as that of bits of fail data input thereto, said bit position setting means being composed of a bit position setting register for setting bit setting data of bits equal in number to fail data, a plurality of AND circuits for ANDing corresponding bits of said bit setting data and said fail data, and an OR circuit for Oring the outputs from said plurality of AND circuits, and the output from each of said bit position setting means being provided as data of a predetermined bit position from said fail data compressing/bit position setting means.

4. A method for storing, in a failure analysis memory, fail data which is the result of comparison by logic comparators between data read out of a plurality of memories under test and expectation data, said method comprising the steps of:

compressing said fail data from each of said logic comparators into one-bit fail data; and for each of said logic comparators, storing said one-bit compressed fail data in a memory part at a respective bit position of a word of said memory part.

5. The method of claim 4, further comprising the step of selectively storing, in said memory part, fail data from one of said logic comparators.

6. A failure analysis memory for storing fail data which is the results of comparisons by logic comparators between data read out of a plurality of memories under test and expectation data, said failure analysis memory comprising:

a plurality of fail data compressing/bit position setting means each supplied with said fail data composed of a plurality of words each of which is composed of a plurality of bits each representing each of respective memory cells of one memory under test from one of said logic comparators, for compressing the plurality of bits for each word of said fail data into one-bit for each word of the fail data and for setting it to a different bit position which is different from bit positions that are set by the other of the plurality of fail data compressing/bit position setting means; and a memory part including a plurality of storage areas which are arranged in a plurality of bit positions for each word corresponding to the bit positions for each word of each said fail data; wherein said memory part stores therein at corresponding bit positions of respective words said compressed fail data of different bit positions from said plurality of fail data compressing/bit position setting means.

* * * * *